(12) United States Patent
Sawashi

(10) Patent No.: US 7,142,051 B2
(45) Date of Patent: Nov. 28, 2006

(54) POWER AMPLIFICATION CIRCUITS

(75) Inventor: Tokihiko Sawashi, Tokyo (JP)

(73) Assignee: Sony Corporation (JP)

( * ) Notice: Subject to any disclaimer, the term of this patent is extended or adjusted under 35 U.S.C. 154(b) by 85 days.

(21) Appl. No.: 10/978,539

(22) Filed: Nov. 1, 2004

(65) Prior Publication Data
US 2005/0151584 A1    Jul. 14, 2005

(30) Foreign Application Priority Data
Nov. 6, 2003   (JP) .............................. 2003-376434

(51) Int. Cl.
*H03F 3/38* (2006.01)
(52) U.S. Cl. ......................................................... 330/10
(58) Field of Classification Search ................ 330/251, 330/10, 207 A
See application file for complete search history.

(56) References Cited

U.S. PATENT DOCUMENTS

| 4,415,862 | A   |   | 11/1983 | Kunugi |       |
|-----------|-----|---|---------|--------|-------|
| 6,064,259 | A   | * | 5/2000  | Takita | 330/10 |
| 6,294,954 | B1  | * | 9/2001  | Melanson | 330/10 |
| 6,373,336 | B1  |   | 4/2002  | Anderskouv et al. | |
| 6,429,737 | B1  |   | 8/2002  | O'Brien | |
| 2003/0006838 | A1 |  | 1/2003  | Yeongha et al. | |

FOREIGN PATENT DOCUMENTS

JP    2002-158544 A    5/2002

* cited by examiner

*Primary Examiner*—Robert Pascal
*Assistant Examiner*—Hieu Nguyen
(74) *Attorney, Agent, or Firm*—Lerner, David, Littenberg, Krumholz & Mentlik, LLP

(57) ABSTRACT

A power amplification circuit includes a PWM signal generating portion operable to produce from an input signal first and second PWM signals having complementary variations in their respective pulse widths, a first delaying portion operable to delay the first PWM signal by a first time to produce a first delayed PWM signal, a first switching amplifier operable to perform a switching operation in response to the first delayed PWM signal to subject the first delayed PWM signal to power amplification to produce a first output signal, and to supply the first output signal to a circuit load, a second delaying portion operable to delay the second PWM signal by a second time different from the first time to produce a second delayed PWM signal, and a second switching amplifier operable to perform a switching operation in response to the second delayed PWM signal to subject the second delayed PWM signal to power amplification to produce a second output signal, and to supply the second output signal to the circuit load.

4 Claims, 3 Drawing Sheets

FIG. 2A   PP   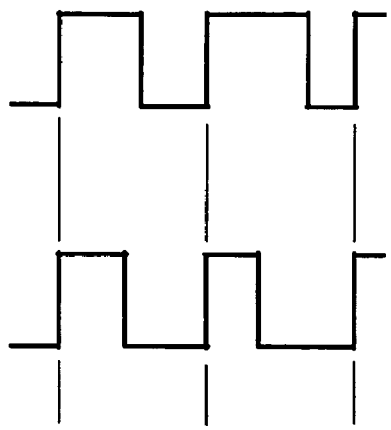
FIG. 2B   PN   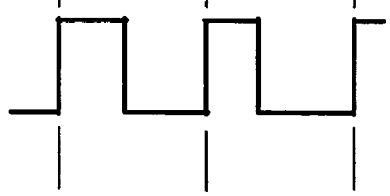
FIG. 3A   PPD  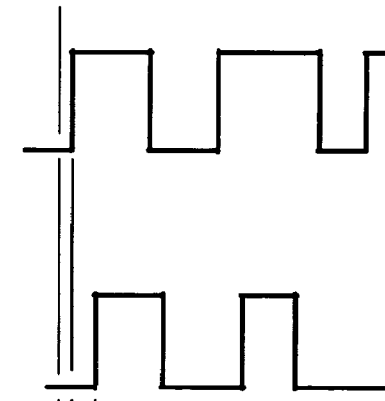
FIG. 3B   PND  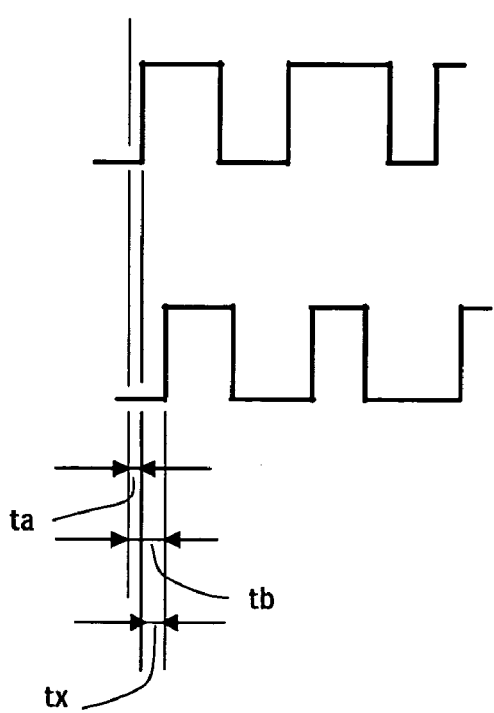

FIG. 4A OPP
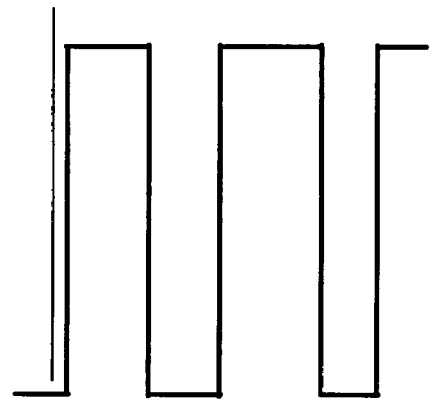
FIG. 4B OPN
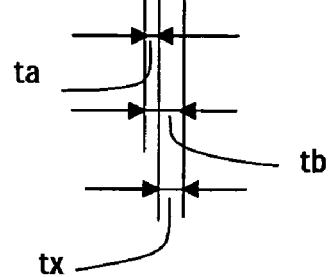

POWER AMPLIFICATION CIRCUITS

CROSS-REFERENCE TO RELATED APPLICATIONS

The present application claims priority from Japanese Application No. P2003-376434 filed Nov. 6, 2003, the disclosure of which is hereby incorporated by reference herein.

BACKGROUND OF THE INVENTION

The present invention relates generally to power amplification circuits, and more particularly, to an improvement in a circuit for performing a switching operation in response to a pulse width modulation (hereinafter, referred to as PWM) signal based on an audio signal or the like so as to cause the PWM signal to be subjected to power amplification, and then supplying a circuit load including a speaker or the like with an output signal obtained with the power amplification.

In the field of acoustic apparatus operative to amplify an audio signal and supply a speaker with the amplified audio signal to obtain reproduced sound based on the audio signal, there have been proposed various systems for amplifying the audio signal in pursuit of the respective purposes assigned thereto. In particular, with respect to power amplification performed to obtain, based on an input audio signal, an output audio signal used for driving a speaker, a D-class amplification which is carried out by an active amplifying element, such as a transistor, functioning in the manner of D-class operation, is often adopted because a relatively superior distortion characteristic can be obtained thereby.

D-class amplification is generally performed with a switching operation of an active amplifying element, for example, a transistor, in response to an input signal which is an audio signal or the like. In the case of a power amplification circuit which performs D-class amplification for audio signals, there previously has been proposed such a circuit that is operable first to produce a PWM signal based on an input audio signal, then to cause the PWM signal to be subjected to power amplification, and to supply a speaker portion with the amplified PWM signal through a low pass filter (hereinafter, referred to as LPF), as shown in, for example, Japanese patent application published before examination under publication number 2002-158544.

The power amplification circuit previously proposed is configured to be a so-called Balanced Transformerless (hereinafter, referred to as BTL) type, namely, a power amplification circuit in which a couple of switching amplifier portions are provided for driving a speaker portion connected in common to the switching amplifier portions. In such a power amplification circuit, a pulse width modulation amplifier is provided for producing first and second PWM signals having complementary variations in the respective pulse widths caused in response to a digital signal in an audio frequency band as the input audio signal. The first PWM signal obtained from the pulse width modulation amplifier is subjected to power amplification carried out with the switching operation of a first power switching circuit (a first switching amplifier) performed in response to the first PWM signal, and a first PWM power signal which is obtained as an output signal of the first power switching circuit is supplied to a first power LPF. The second PWM signal obtained from the pulse width modulation amplifier is subjected to power amplification carried out with the switching operation of a second power switching circuit (a second switching amplifier) performed in response to the second PWM signal, and a second PWM power signal which is obtained as an output signal of the second power switching circuit is supplied to a second power LPF.

Then, a couple of signals derived, respectively, from the first and second power LPFs, which are opposite one another in polarity, are supplied to the speaker portion connected to both of the first and second power LPFs. As a result, the speaker portion is driven differentially with the signals contrary opposite one another in polarity to reproduce sound in response to the input audio signal.

In the previously proposed power amplification circuit mentioned above, the first and second PWM signals obtained from the pulse width modulation amplifier based on the digital signal in the audio frequency band as the input audio signal are produced, for example, with the use of a common clock signal and therefore have the respective periods synchronized with one another. Accordingly, the rising or falling edge at the beginning of each period of the first PWM signal appears at substantially the same time as the rising or falling edge at the beginning of each period of the second PWM signal, disregarding extremely slight accidental time differences. This means that the switching operation of the first power switching circuit in response to the rising or falling edge at the beginning of each period of the first PWM signal is performed at substantially the same time as the switching operation of the second power switching circuit in response to the rising or falling edge at the beginning of each period of the second PWM signal, disregarding extremely slight accidental time differences.

In each of the first and second power switching circuits, an overshooting or undershooting variation caused by ringing or the like appears on the rising or falling edge of the first or second PWM power signal whenever the switching operation is performed in response to the first or second PWM signal. The overshooting or undershooting variation thus appearing on the rising or falling edge of the first or second PWM power signal results in undesirable noise.

Under such circumstances, when the switching operation of the first power switching circuit in response to the rising or falling edge at the beginning of each period of the first PWM signal is performed at substantially the same time as the switching operation of the second power switching circuit in response to the rising or falling edge at the beginning of each period of the second PWM signal, disregarding extremely slight accidental time differences as described above, one of the noise resulting from the overshooting or undershooting variation appearing on the rising or falling edge of the first PWM power signal in the first power switching circuit and the noise resulting from the overshooting or undershooting variation appearing on the rising or falling edge of the second PWM power signal in the second power switching circuit is substantially superimposed upon the other of them so as to generate relatively large noise. It is feared that the relatively large noise thus generated in the first and second power switching circuits exerts a bad influence upon a load portion including the first and second power LPFs and the speaker portion, is transmitted to the outside as unwanted radiation so as to disturb communications on the outside and further exerts a bad influence upon electronic apparatus used on the outside.

In particular, in the case of a multi-channel acoustic apparatus in which a plurality of couples of power switching circuits each corresponding to the first and second power switching circuits are provided for multi-channel signals, respectively, it is feared that interference, bad influence and so on to the outside which results from the noise generated by the switching operation in each couple of the power switching circuits may grow worse.

SUMMARY OF THE INVENTION

The present invention provides a power amplification circuit by which a couple of PWM signals are produced in response to an input signal, the PWM signals having complementary variations in their respective pulse widths. The PWM signals thus produced are subjected to power amplification carried out by a couple of switching amplifiers, and output signals obtained from the switching amplifiers, respectively, are supplied to a circuit load including at least a speaker portion. The power amplification circuit thus avoids the aforementioned disadvantages encountered with the prior art.

The present invention also provides a power amplification circuit by which a couple of PWM signals are produced in response to an input signal, the PWM signals having complementary variations in their respective pulse widths. The PWM signals thus produced are subjected to power amplification carried out by a couple of switching amplifiers, and output signals obtained from the switching amplifiers, respectively, are supplied to a circuit load including at least a speaker portion. Noise generated in one of the switching amplifiers and noise generated in the other of the switching amplifiers are dispersed in time.

The present invention also provides a power amplification circuit by which a couple of PWM signals are produced in response to an input signal, the PWM signals having complementary variations in their respective pulse widths. The PWM signals thus produced are subjected to power amplification performed by a couple of switching amplifiers, and output signals obtained from the switching amplifiers, respectively, are supplied to a circuit load including at least a speaker portion. Noise generated in one of the switching amplifiers and noise generated in the other of the switching amplifiers are dispersed in time so that interference, bad influence and so on to the outside which results from the noise generated in each of the switching amplifiers can be effectively restrained.

According to the present invention, there is provided a power amplification circuit which includes a PWM signal generating portion operable to produce from an input signal first and second PWM signals having complementary variations in their respective pulse widths, a first delaying portion operable to delay the first PWM signal by a first time to produce a first delayed PWM signal, a first switching amplifier operable to perform a switching operation in response to the first delayed PWM signal to subject the first delayed PWM signal to power amplification to produce a first output signal, and to supply the first output signal to a circuit load, a second delaying portion operable to delay the second PWM signal by a second time different from the first time to produce a second delayed PWM signal, and a second switching amplifier operable to perform a switching operation in response to the second delayed PWM signal to subject the second delayed PWM signal to power amplification to produce a second output signal, and to supply the second output signal to the circuit load.

In the power amplification circuit thus constituted in accordance with the present invention, the first and second PWM signals are obtained from the PWM signal generating portion. The first PWM signal is delayed in the first delaying portion by the first time so as to be supplied to the first switching amplifier as the first delayed PWM signal, and the second PWM signal is delayed in the second delaying portion by the second time which is different from the first time so as to be supplied to the second switching amplifier as the second delayed PWM signal. The first switching amplifier performs the switching operation in response to the first delayed PWM signal to cause the first delayed PWM signal to be subjected to power amplification to produce the first output signal and the second switching amplifier performs the switching operation in response to the second delayed PWM signal to cause the second delayed PWM signal to be subjected to power amplification to produce the second output signal. Then, the first output signal and the second output signal are supplied to the circuit load.

Accordingly, with the power amplification circuit according to the present invention, the switching operation of the first switching amplifier is performed in response to the first delayed PWM signal at a point of time different from that at which the switching operation of the second switching amplifier is performed in response to the second delayed PWM signal, so that noise generated with the switching operation of the first switching amplifier and noise generated with the switching operation of the second switching amplifier are dispersed in time. Consequently, interference, bad influence and so on to the outside which results from the noise generated in each of the first and second switching circuits can be effectively restrained.

Incidentally, the difference in the delay time between the first and second delayed PWM signals is a relatively short time, for example, ten or less times as long as the period of a clock signal used to produce the first and second PWM signals in the PWM signal generating portion so as to prevent the first and second output signals, which are derived from the first and second switching amplifiers, respectively, from bringing about substantial distortions when combined in the circuit load.

The above and other objects, features and advantages of the present invention will become apparent from the following detailed description taken in conjunction with the accompanying drawings.

BRIEF DESCRIPTION OF THE DRAWINGS

FIGS. 2A, 2B, 3A, 3B, 4A and 4B are signal waveform diagrams used for explaining the operation of the embodiment shown in FIG. 1.

DETAILED DESCRIPTION

Figure 1:
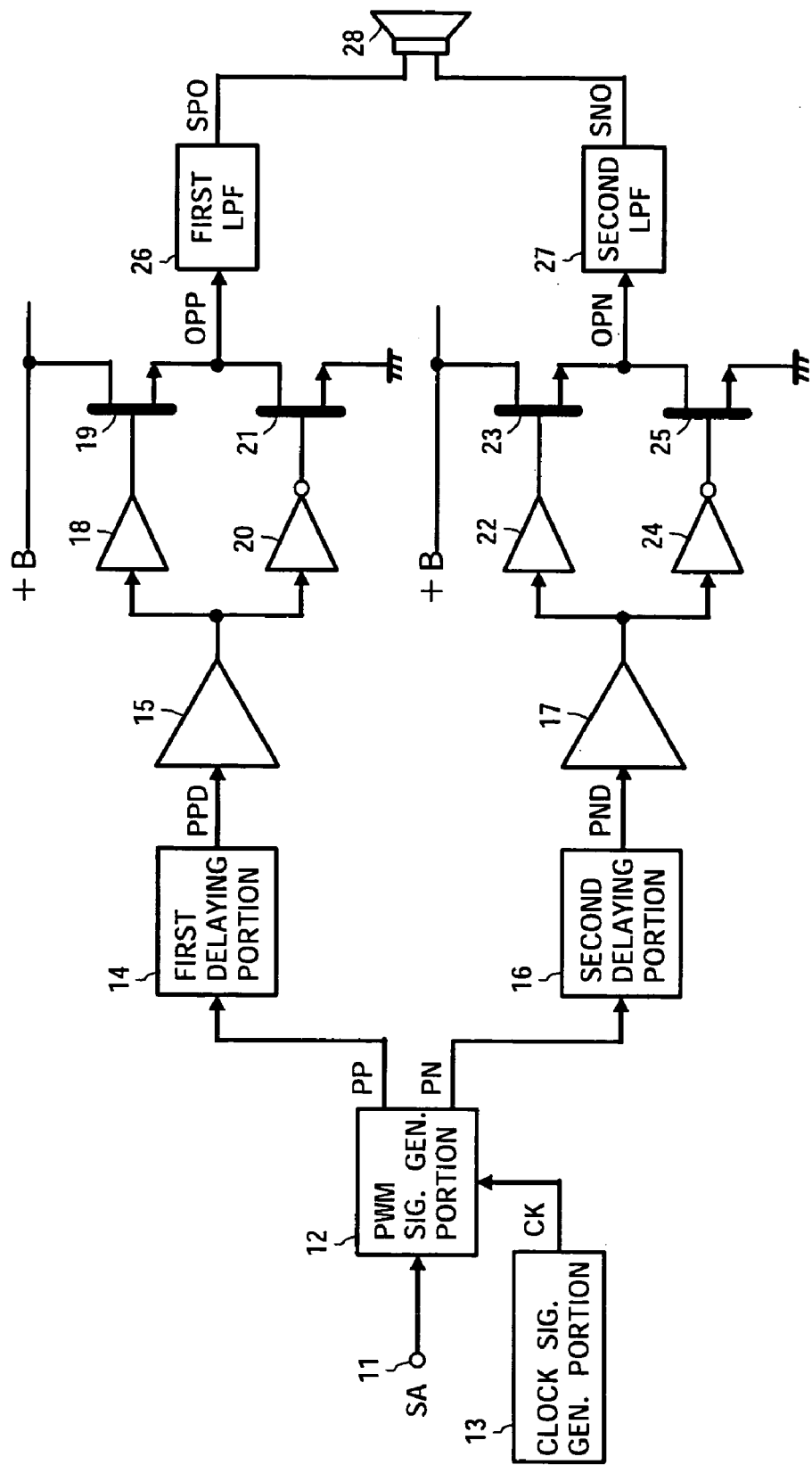
FIG. 1 is a schematic circuit diagram showing an embodiment of the power amplification circuit according to the present invention.

FIG. 1 shows an embodiment of the power amplification circuit according to the present invention.

Referring to FIG. 1, for example, an audio signal SA is supplied through an input terminal 11 to a PWM signal generating portion 12 as an input signal. A clock signal CK obtained from a clock signal generator 13 is also supplied to the PWM signal generating portion 12. The clock signal CK is selected to have its period corresponding to, for example, 20 nsec (20 nanoseconds) or so.

The PWM signal generating portion 12 produces a first PWM signal PP and a second PWM signal PN with the use of the clock signal CK. Signals PP and PN have complementary variations in their respective pulse widths caused in response to the audio signal SA, as shown in FIGS. 2A and 2B. (That is, signals PP and PN are contrary to one another in variations in their respective pulse widths caused in response to the audio signal SA.) In the relation between the first and second PWM signals PP and PN, the pulse width of the second PWM signal PN decreases in response to the audio signal SA when the pulse width of the first PWM signal PP increases in response to the audio signal SA, and the pulse width of the second PWM signal PN increases in response to the audio signal SA when the pulse width of the first PWM signal PP decreases in response to the audio signal SA. The first and second PWM signals PP and PN are produced with the use of a common clock signal, namely, the common clock signal CK, and therefore have the respective periods synchronized with each other so that the rising or falling edge at the beginning of each period of the first PWM signal PP and the rising or falling edge at the beginning of each period of the second PWM signal PN appear at substantially the same time.

The first PWM signal PP obtained from the PWM signal generating portion 12 is delayed in a first delaying portion 14 by a predetermined first time ta, and is supplied to a buffer amplifier 15 as a delayed PWM signal PPD, as shown in FIG. 3A. The second PWM signal PN obtained from the PWM signal generating portion 12 is delayed in a second delaying portion 16 by a predetermined second time tb which is different from the first time ta, and is supplied to a buffer amplifier 17 as a second delayed PWM signal PND, as shown in FIG. 3B.

The difference between the first time ta by which the first PWM signal PP is delayed and the second time tb by which the second PWM signal PN is delayed is determined to be, for example, ten or less times as long as the period of the clock signal CK, which corresponds to, for example, 20 nsec. The clock signal CK supplied from the clock signal generating portion 13 to the PWM signal generating portion 12 is used for producing the first and second PWM signals PP and PN in the PWM signal generating portion 12. Accordingly, there is a time difference tx between the delayed PWM signals PPD and PND which is, for example, ten or less times as long as the period of the clock signal CK corresponding to, for example, 20 nsec so that a rising or falling edge at the beginning of each period of the delayed PWM signal PPD and a rising or falling edge at the beginning of each period of the delayed PWM signal PND appear with the same time difference tx. FIGS. 3A and 3B show a condition in which the rising edge at the beginning of each period of the delayed PWM signal PPD and the rising edge at the beginning of each period of the delayed PWM signal PND appear with the time difference tx.

The delayed PWM signals PPD and PND are amplified in the buffer amplifiers 15 and 17, respectively.

The delayed PWM signal PPD obtained from the buffer amplifier 15 is supplied through an amplifier 18, which is operable not to cause the delayed PWM signal PPD to be subjected to an inversion in polarity, to the gate of a field effect transistor (hereinafter, referred to as FET) 19, and supplied also through an amplifier 20, which is operable to cause the delayed PWM signal PPD to be subjected to an inversion in polarity, to the gate of an FET 21. The drain of the FET 19 is connected to a power supplying line +B, the source of the FET 19 is connected to the drain of the FET 21 and the source of the FET 21 is grounded. Each of the FETs 19 and 21 is operable to function as a switching element and the FETs 19 and 21 constitute, together with other parts, a first switching amplifier which is operable to cause the delayed PWM signal PPD supplied thereto to be power amplified.

The FET 19 is operable to perform a switching operation (ON to OFF or OFF to ON) in response to each of the rising and falling edges of the delayed PWM signal PPD which has passed through the amplifier 18 so as not to be subjected to an inversion in polarity and the FET 21 is operable to perform another switching operation (ON to OFF or OFF to ON) in response to each of the rising and falling edges of the delayed PWM signal PPD which has passed through the amplifier 20 so as to be subjected to an inversion in polarity. With such switching operation of each of the FETs 19 and 21, the delayed PWM signal PPD is subjected to power amplification and a first output signal OPP is obtained at a connecting point between the source of the FET 19 and the drain of the FET 21, as shown in FIG. 4A.

The delayed PWM signal PND obtained from the buffer amplifier 17 is supplied through an amplifier 22, which is operable not to cause the delayed PWM signal PND to be subjected to an inversion in polarity, to the gate of an FET 23, and supplied also through an amplifier 24, which is operable to cause the delayed PWM signal PND to be subjected to an inversion in polarity, to the gate of an FET 25. The drain of the FET 23 is connected to a power supplying line +B, the source of the FET 23 is connected to the drain of the FET 25 and the source of the FET 25 is grounded. Each of the FETs 23 and 25 is operable to function as a switching element and the FETs 23 and 25 constitute, together with other parts, a second switching amplifier which is operable to cause the delayed PWM signal PND supplied thereto to be power amplified.

The FET 23 is operable to perform a switching operation (ON to OFF or OFF to ON) in response to each of the rising and falling edges of the delayed PWM signal PND which has passed through the amplifier 22 so as not to be subjected to an inversion in polarity and the FET 25 is operable to perform another switching operation (ON to OFF or OFF to ON) in response to each of the rising and falling edges of the delayed PWM signal PND which has passed through the amplifier 24 so as to be subjected to an inversion in polarity. With such switching operations of the FETs 23 and 25, the delayed PWM signal PND is subjected to power amplification and a second output signal OPN is obtained at a connecting point between the source of the FET 23 and the drain of the FET 25, as shown in FIG. 4B.

There is a time difference tx between the first and second output signals OPP and OPN, which is, for example, ten or less times as long as the period of the clock signal CK corresponding to, for example, 20 nsec and results from the time difference tx between the delayed PWM signals PPD and PND, so that a rising or falling edge at the beginning of each period of the first output signal OPP and a rising or falling edge at the beginning of each period of the second output signal OPN appear with the same time difference tx. FIGS. 4A and 4B show a condition in which the rising edge at the beginning of each period of the first output signal OPP and the rising edge at the beginning of each period of the second output signal OPN appear with the time difference tx.

In the first switching amplifier comprising the FETs 19 and 21, noise resulting from the switching operation of each of the FETs 19 and 21 is generated when the delayed PWM signal PPD is subjected to power amplification to produce the first output signal OPP. Each of the FETs 19 and 21 performs the switching operation in response to each of the rising and falling edges of the delayed PWM signal PPD and therefore the noise resulting from the switching operation of each of the FETs 19 and 21 is generated at every point of time at which the rising or falling edge of the delayed PWM signal PPD appears.

Similarly, in the second switching amplifier comprising the FETs 23 and 25, noise resulting from the switching operation of each of the FETs 23 and 25 is generated when the delayed PWM signal PND is subjected to power amplification to produce the second output signal OPN. Each of the FETs 23 and 25 performs the switching operation in response to each of the rising and falling edges of the delayed PWM signal PND and therefore the noise resulting from the switching operation of each of the FETs 23 and 25 is generated at every point of time at which the rising or falling edge of the delayed PWM signal PND appears.

As aforementioned, there is a time difference tx between the delayed PWM signals PPD and PND, so that the rising or falling edge at the beginning of each period of the delayed PWM signal PPD and the rising or falling edge at the beginning of each period of the delayed PWM signal PND appear with the time difference tx. Accordingly, the point of time at which the noise is generated with the switching operation of each of the FETs 19 and 21 in the first switching amplifier and the point of time at which the noise is generated with the switching operation of each of the FETs 23 and 25 in the second switching amplifier are dispersed to be almost out of the bounds of possibility of coinciding with each other. As a result, it is unlikely that the noise resulting from the switching operation in the first switching amplifier will be substantially superimposed upon the noise resulting from the switching operation in the second switching amplifier so as to generate a relatively large noise which can then be transmitted to the outside as unwanted radiation so as to disturb communications on the outside and further exert a bad influence upon electronic apparatus used on the outside.

The first output signal OPP obtained at the connecting point between the source of the FET 19 and the drain of the FET 21 in the first switching amplifier is supplied to a first LPF 26 and an analog signal SPO varying in level in response to the first output signal OPP is derived from the first LPF 26. The second output signal OPN obtained at the connecting point between the source of the FET 23 and the drain of the FET 25 in the second switching amplifier is supplied to a second LPF 27 and an analog signal SNO varying in level in response to the second output signal OPN is derived from the second LPF 27.

The analog signals SPO and SNO derived from the first and second LPFs 26 and 27, respectively, are supplied to a speaker portion 28 constituting a terminal load portion as power-amplified audio signals based on the audio signal SA which is supplied through the input terminal 11 to the PWM signal generating portion 12 as the input signal. Consequently, the speaker portion 28 is driven with the analog signals SPO and SNO combined with each other therein to reproduce sound in response to the audio signal SA as the input signal.

Under such a situation, since the time difference tx between the first output signal OPP and the second output signal OPN is selected to be such a relatively short time, that is, for example, ten or less times as long as the period of the clock signal CK corresponding to, for example, 20 nsec, the analog signals SPO and SNO supplied to the speaker portion 28 for driving the same are prevented from bringing about substantial distortions thereon when combined in the speaker portion 28.

In the embodiment thus constructed to operate as described above, the first and second LPFs 26 and 27 and the speaker portion 28 constitute a circuit load provided in common to the first switching amplifier comprising the FETs 19 and 21 and the second switching amplifier comprising the FETs 23 and 25.

The embodiment shown in FIG. 1 can be used not only alone for power amplification in a single-channel acoustic apparatus, but also in a group arranged in parallel for power amplification in a multi-channel acoustic apparatus.

Further, although the first switching amplifier comprises the FETs 19 and 21 and the second switching amplifier comprises the FETs 23 and 25 in the embodiment shown in FIG. 1, it should be understood that active elements other than the FETs 19, 21, 23 and 25, for example, a plurality of bipolar transistors, can be used to constitute the first and second switching amplifiers.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A power amplification circuit, comprising:
a pulse width modulation signal generating portion operable to produce from an input signal first and second pulse width modulation signals having complementary variations in their respective pulse widths;
a first delaying portion operable to delay the first pulse width modulation signal by a first time to produce a first delayed pulse width modulation signal;
a first switching amplifier operable to perform a switching operation in response to the first delayed pulse width modulation signal to subject the first delayed pulse width modulation signal to power amplification to produce a first output signal, and to supply the first output signal to a circuit load;
a second delaying portion operable to delay the second pulse width modulation signal by a second time different from the first time to produce a second delayed pulse width modulation signal; and
a second switching amplifier operable to perform a switching operation in response to the second delayed pulse width modulation signal to subject the second delayed pulse width modulation signal to power amplification to produce a second output signal, and to supply the second output signal to the circuit load.

2. A power amplification circuit according to claim 1, wherein the circuit load comprises a first low pass filter to which the first output signal is supplied, a second low pass filter to which the second output signal is supplied, and a terminal load portion to which signals obtained from the first and second low pass filters, respectively, are supplied.

3. A power amplification circuit according to claim 1, wherein the input signal is an audio signal and the terminal load portion includes a speaker connected to the first and second low pass filters.

4. A power amplification circuit according to claim 1, wherein the pulse width modulation signal generating portion produces the first and second pulse width modulation signals using a clock signal, and a time difference between the first time and the second time is ten or less times as long as a period of the clock signal.

* * * * *